(12) United States Patent
Taira

(10) Patent No.: US 11,056,266 B2
(45) Date of Patent: Jul. 6, 2021

(54) FILTER DEVICE AND POWER CONVERTER

(71) Applicant: Mitsubishi Electric Corporation, Tokyo (JP)

(72) Inventor: Satoshi Taira, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 32 days.

(21) Appl. No.: 16/348,154

(22) PCT Filed: Dec. 26, 2016

(86) PCT No.: PCT/JP2016/088718
§ 371 (c)(1),
(2) Date: May 8, 2019

(87) PCT Pub. No.: WO2018/122923
PCT Pub. Date: Jul. 5, 2018

(65) Prior Publication Data
US 2019/0371510 A1 Dec. 5, 2019

(51) Int. Cl.
*H01F 27/08* (2006.01)
*H03H 7/01* (2006.01)
*H01F 27/02* (2006.01)
*H02M 1/12* (2006.01)

(52) U.S. Cl.
CPC ........... *H01F 27/08* (2013.01); *H01F 27/025* (2013.01); *H02M 1/126* (2013.01); *H03H 7/17* (2013.01)

(58) Field of Classification Search
CPC ......... H01F 27/08; H03H 7/01; H03H 1/0007
USPC ................................................. 333/181, 185
See application file for complete search history.

(56) References Cited

U.S. PATENT DOCUMENTS

| | | | |
|---|---|---|---|
| 9,691,535 B2* | 6/2017 | Takano | H01F 27/24 |
| 2002/0134531 A1 | 9/2002 | Yanagida | |
| 2014/0160818 A1* | 6/2014 | Garces | H02M 7/5395 363/97 |
| 2015/0351278 A1 | 12/2015 | Shirouzu | |

(Continued)

FOREIGN PATENT DOCUMENTS

| | | |
|---|---|---|
| CN | 202475962 U | 10/2012 |
| CN | 204349815 U | 5/2015 |
| JP | 2002-280778 A | 9/2002 |

(Continued)

OTHER PUBLICATIONS

International Search Report and Written Opinion dated Mar. 7, 2017 for PCT/JP2016/088718 filed on Dec. 26, 2016, 9 pages including Translation of the International Search Report.

(Continued)

*Primary Examiner* — Rakesh B Patel
(74) *Attorney, Agent, or Firm* — Xsensus LLP

(57) ABSTRACT

Provided is a filter device to be connected between an AC power source (1) and a PWM converter (2), which includes a first AC reactor (3), a second AC reactor (4) that is connected between the PWM converter (2) and the first AC reactor (3), a filter capacitor (5) whose one end is connected to a connecting portion (9) between the first AC reactor (3) and the second AC reactor (4), and a housing (15) having a cooling air inlet (16) and a cooling air outlet (17) and containing the first AC reactor (3) and the second AC reactor (4), wherein the first AC reactor (3) is disposed upwind of the second AC reactor (4).

20 Claims, 9 Drawing Sheets

(56) References Cited

U.S. PATENT DOCUMENTS

2015/0380147 A1 12/2015 Takano
2016/0204689 A1 7/2016 Wennerstrom et al.

FOREIGN PATENT DOCUMENTS

JP 2013-158092 A 8/2013
JP 2014-207845 A 10/2014
JP 2015-228726 A 12/2015
WO 2015/033710 A1 3/2015

OTHER PUBLICATIONS

Notification of Reasons for Refusal received for Japanese Patent Application No. 2017-194028, dated Nov. 6, 2018, 6 pages including English Translation.
Office Action dated Jul. 2, 2020 in Chinese Patent Application No. 201680091822.2, 10 pages.
Office Action dated Jul. 26, 2020 in Indian Patent Application No. 201927024009, 6 pages.
Korean Office Action dated Jun. 10, 2020, in corresponding Korean Patent Application No. 10-2019-7017783.
Office Action dated Nov. 24, 2020, in corresponding Korean patent Application No. 10-2019-7017783, 12 pages.

* cited by examiner

Fig. 4
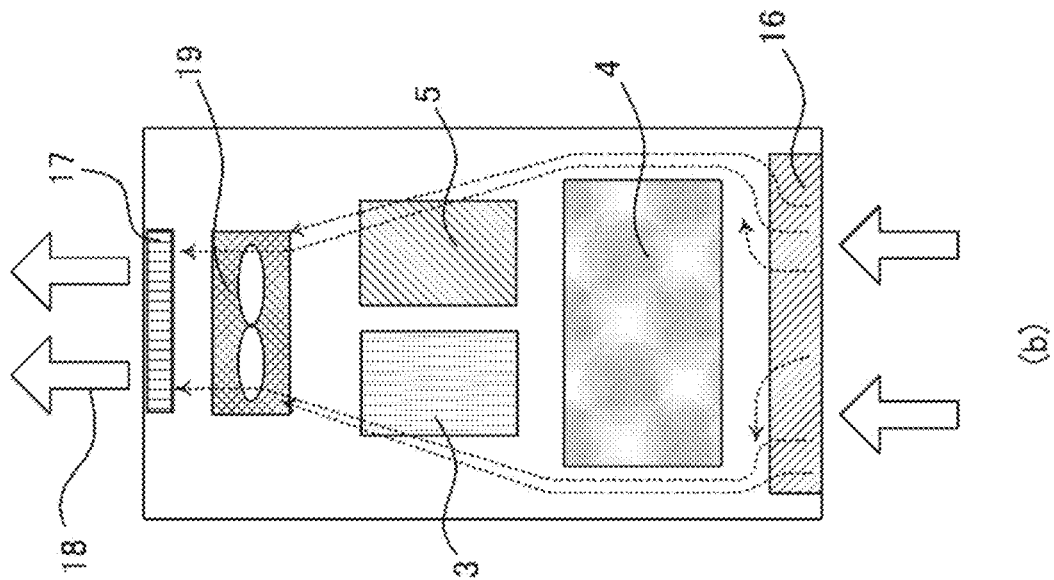
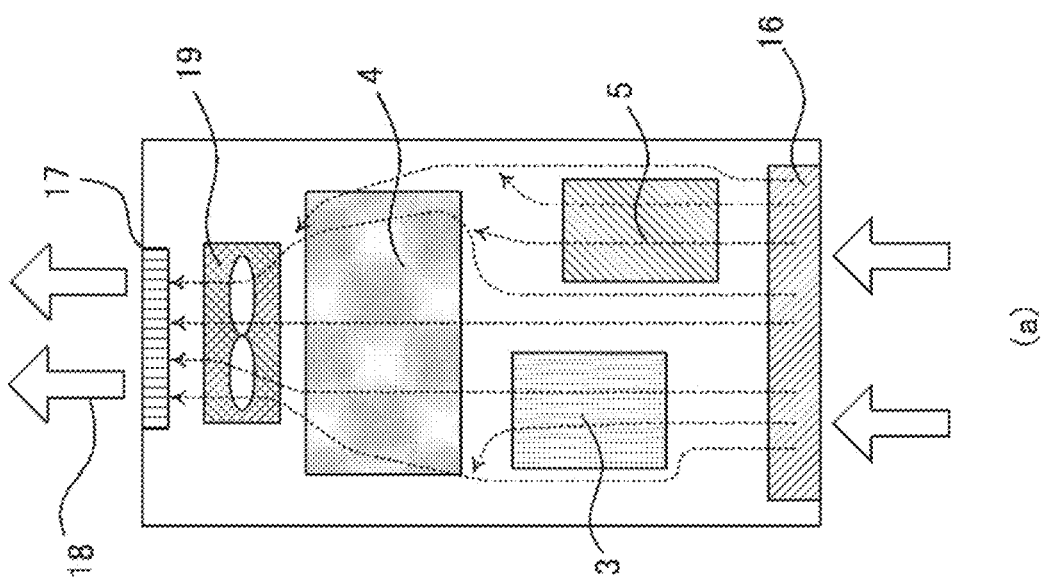

FILTER DEVICE AND POWER CONVERTER

CROSS-REFERENCE TO RELATED APPLICATIONS

The present application is based on PCT filing PCT/JP2016/088718 filed Dec. 26, 2016, the entire contents of which are incorporated herein by reference.

TECHNICAL FIELD

The present invention relates to a filter device used for a power converter.

BACKGROUND ART

As a power converter to convert AC power to DC power, there is known a pulse width modulation (PWM) converter that can reduce harmonics and improve the power factor. When a PWM converter is used, in order to prevent outflow of carrier ripple current caused by PWM switching into the power supply system, a technique is known in which a T-type LC circuit is electrically connected between the PWM converter and the AC power source.

Here, a T-type LC circuit is composed of multiple capacitors and reactors including a first AC reactor disposed on the AC power source side and a second AC reactor disposed on the PWM converter side. In view of reduction of man-hours for wiring at a customer site as well as space saving for installation, it has been proposed to contain these components in the same housing (for example, Patent document 1).

PRIOR ART DOCUMENT

Patent Document

Patent document 1: International Laid-Open Patent Application No. 2015-033710

SUMMARY OF THE INVENTION

Problems to be Solved by the Invention

In an LC circuit used in a power converter, because high frequency current including the carrier ripple current caused by the PWM switching of the PWM converter, in addition to the base current coming from the AC power source, flows in the second AC reactor disposed on the PWM converter side, the second AC reactor disposed on the PWM converter side is generally larger in size than the first AC reactor disposed on the AC power source side. Thus, Patent document 1 suggests to arrange the second AC reactor being larger in size on the upwind side and the first AC reactor being smaller in size on the downwind side. In the arrangement suggested in Patent document 1, however, the second AC reactor blocks the flow of cooling air, and thus the cooling air does not sufficiently come into contact with the first AC reactor on the downwind side. As a result, a problem arises that performance of the first AC reactor is degraded owing to lack of cooling.

The present invention is devised to solve the above-mentioned problem and to improve cooling performance of the filter device used in power converters.

Means for Solving Problem

A filter device according to the present invention includes a first AC reactor to be connected to an AC power source, a second AC reactor that is connected between a PWM converter and the first AC reactor, a filter capacitor whose one end is connected to a connecting portion between the first AC reactor and the second AC reactor, and a housing having a cooling air inlet and a cooling air outlet and containing the first AC reactor and the second AC reactor, wherein the first AC reactor is disposed upwind of the second AC reactor.

According to the present invention, an effect is such that decrease in cooling performance is avoided, while manufacturing cost is reduced.

BRIEF DESCRIPTION OF THE DRAWINGS

FIG. 4 is a schematic diagram showing an effect of the filter device according to Embodiment 1 of the present invention.

EMBODIMENTS FOR CARRYING OUT THE INVENTION

Hereinafter, filter devices and a power converter according to the embodiments of the present invention will be described in detail on the basis of the drawings. Note that the present invention is not limited to the embodiments shown below.

Embodiment 1

Figure 1:
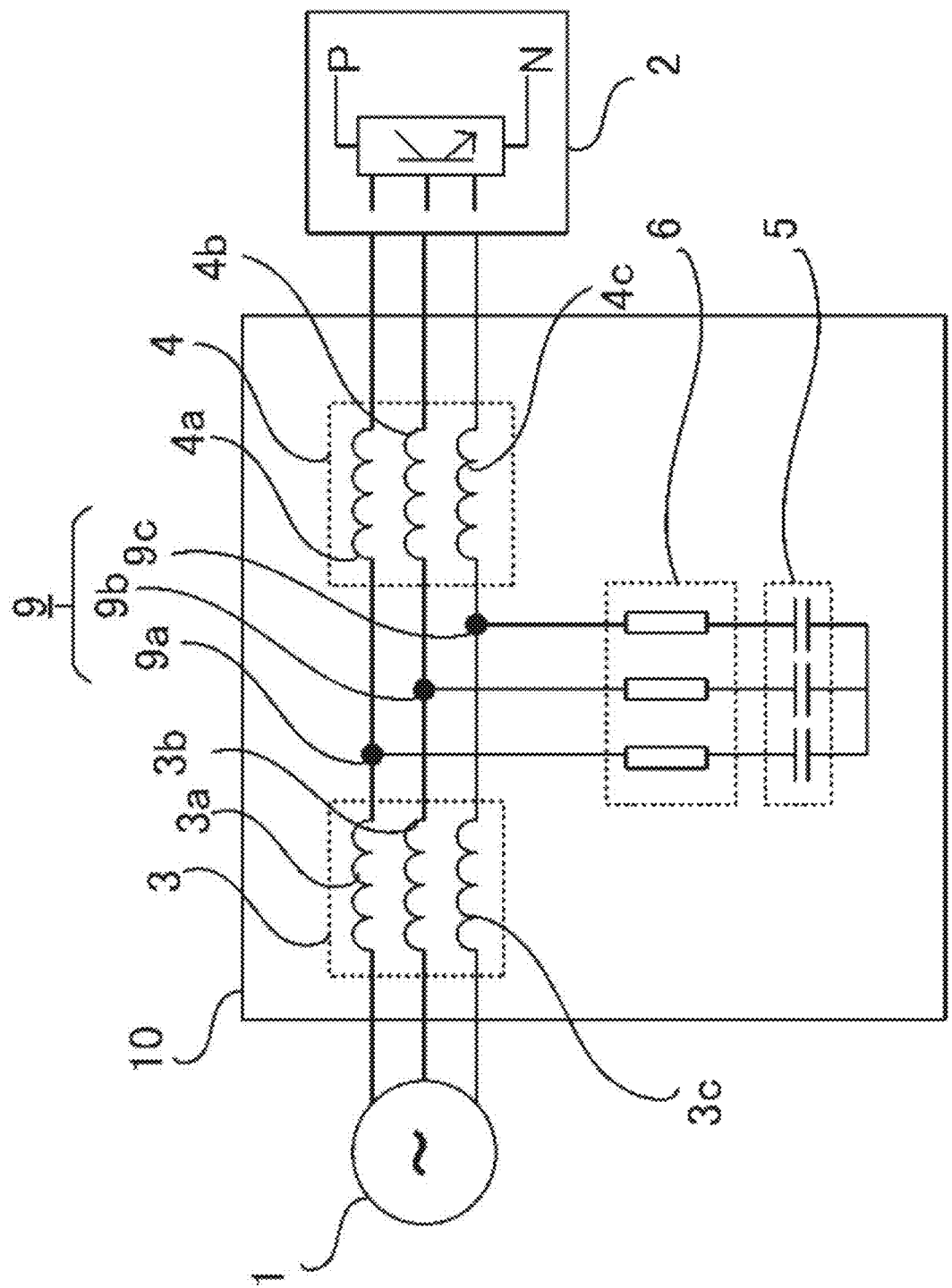
FIG. 1 is a basic circuit diagram of a power conversion circuit using a filter device according to Embodiment 1 of the present invention.

FIG. 1 is a basic circuit diagram showing a power converter using a filter device according to the present embodiment. In the present embodiment, the filter device 10 is connected between an AC power source 1 and a PWM converter 2. Note that, regarding the connection between components described in the present embodiments, the components need to be electrically connected in such a way that effects in the present embodiments can be obtained.

As shown in FIG. 1, the LC filter circuit which constitutes the filter device 10 includes a first AC reactor 3, a second AC reactor 4, filter capacitors 5, and damping resistors 6. The first AC reactor 3 is connected to the AC power source 1, and the second AC reactor 4 is connected between the first AC reactor and the PWM converter 2. First ends of the filter capacitors 5 are connected to connecting portions 9 at which the first AC reactor 3 is connected to the second AC reactor 4. Note that, in FIG. 1, the damping resistors 6 are connected between the connecting portions 9 and the first ends of the filter capacitors 5. Regarding one of the filter capacitors 5, its first end is connected to one of three phases and its second end is connected to second ends of the other filter capacitors 5 connected to different phases. To be more specific, their first ends of three filter capacitors 5 are connected to respective phases at connection portions 9a, 9b, and 9c, while their second ends of the filter capacitors are connected to a common potential.

Note that, in FIG. 1, the filter capacitors 5 of the LC filter circuit constituting the filter device 10 according to the present embodiment are connected in Y connection (star connection). However, δ connection (delta connection) or the like may be used.

The high frequency current caused by the switching in the PWM converter 2 passes through the second AC reactor 4 and then flows toward the filter capacitor 5 where impedance to the high frequency current is lower than that to the first AC reactor 3. This is how the LC filter circuit prevents the outflow of the high frequency current toward the AC power source 1. In addition, the second AC reactor 4 plays a functional role in boosting the voltage between P and N of the PWM converter.

Each damping resistor 6 is provided to reduce resonance noise of the LC filter circuit, but it is not necessarily provided.

The filter device 10 according to the present embodiment is configured in such a manner that the components of the LC filter circuit described above are accommodated in a single housing.

Figure 2:
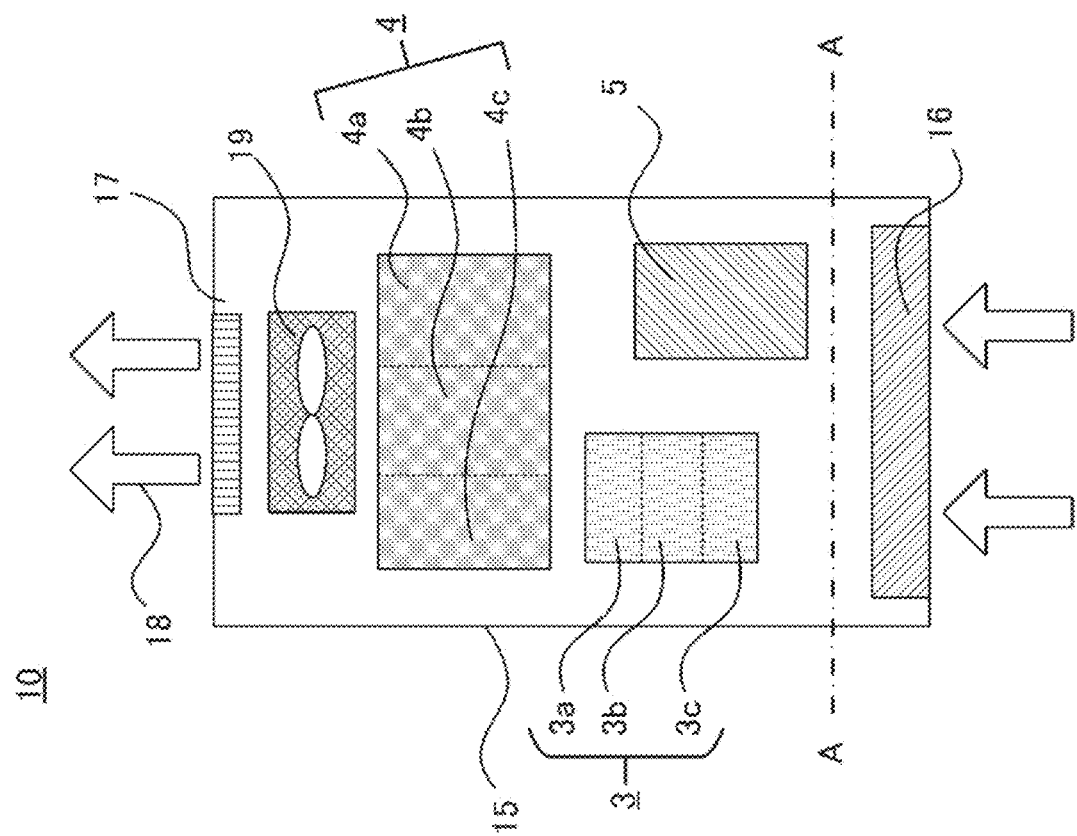
FIG. 2 is a schematic diagram showing an arrangement of LC circuit components of the filter device according to Embodiment 1 of the present invention.

FIG. 2 is a schematic diagram showing a component arrangement of the LC filter device 10 according to the present embodiment. In the present embodiment, three first AC reactors 3a, 3b, and 3c connected to respective phases of the three-phase AC power source, are attached together and shown as a single rectangular outline, and the same are for three second AC reactors 4a, 4b, and 4c. That is, three first AC reactors 3a, 3b, and 3c shown in the circuit diagram of FIG. 1 are attached together to form the first AC reactor 3 shown in FIG. 2. In the same manner, three second AC reactors 4a, 4b, and 4c are attached together to form the second AC reactor 4. Note that, the second AC reactor 4 disposed on the side of the PWM converter 2 is larger in size than the first AC reactor 3 because of the function described above.

In addition, each of the AC reactors (3a, 3b, 3c, 4a, 4b, and 4c) is formed from an iron core made of a magnetic material and from a winding coil wound around the iron core.

As shown in FIG. 2, the housing 15 of the filter device 10 includes the first AC reactor 3, the second AC reactor 4, the filter capacitors 5, a cooling air inlet 16, and a cooling air outlet 17. Thus, these LC filter circuit components disposed in the housing 15 are cooled by cooling air flowing from the cooling air inlet 16 toward the cooling air outlet 17. In FIG. 2, the flow direction of the cooling air is indicated by the arrows 18. In the present embodiment, a fan 19 is provided on the side of the cooling air outlet 17 in the housing 15, and thereby forced air cooling is performed to enhance cooling efficiency. Fans such as the fan 19 installed in the housing 15 is collectively called a fan.

Note here that, in the present embodiment, the fan 19 is provided downwind, and forced air cooling is performed by sucking the air. Instead, not to mention, the fan 19 may be provided on the side of the cooling air inlet 16, and forced air cooling is performed by blowing the air. In addition, the fan 19 may be provided outside the housing 15. For example, in a case where the filter device is installed in a vehicle drive unit and cooled by the flow of the cooling air generated by traveling of the vehicle, the fan 19 may not be provided.

In the example shown in FIG. 2, the first AC reactor 3, the second AC reactor 4, the filter capacitors 5, and the fan 19 are disposed inside the housing 15. If necessary, however, the housing 15 may further include other components such as the damping resistors 6.

In the filter device 10 according to the present embodiment, the first AC reactor 3 is disposed upwind and the second AC reactor is disposed downwind in the housing 15. The first AC reactor 3 being smaller in size is disposed upwind and the second AC reactor 4 being larger in size is disposed downwind, so that both the first AC reactor 3 and the second AC reactor 4 can be cooled efficiently.

Figure 3:
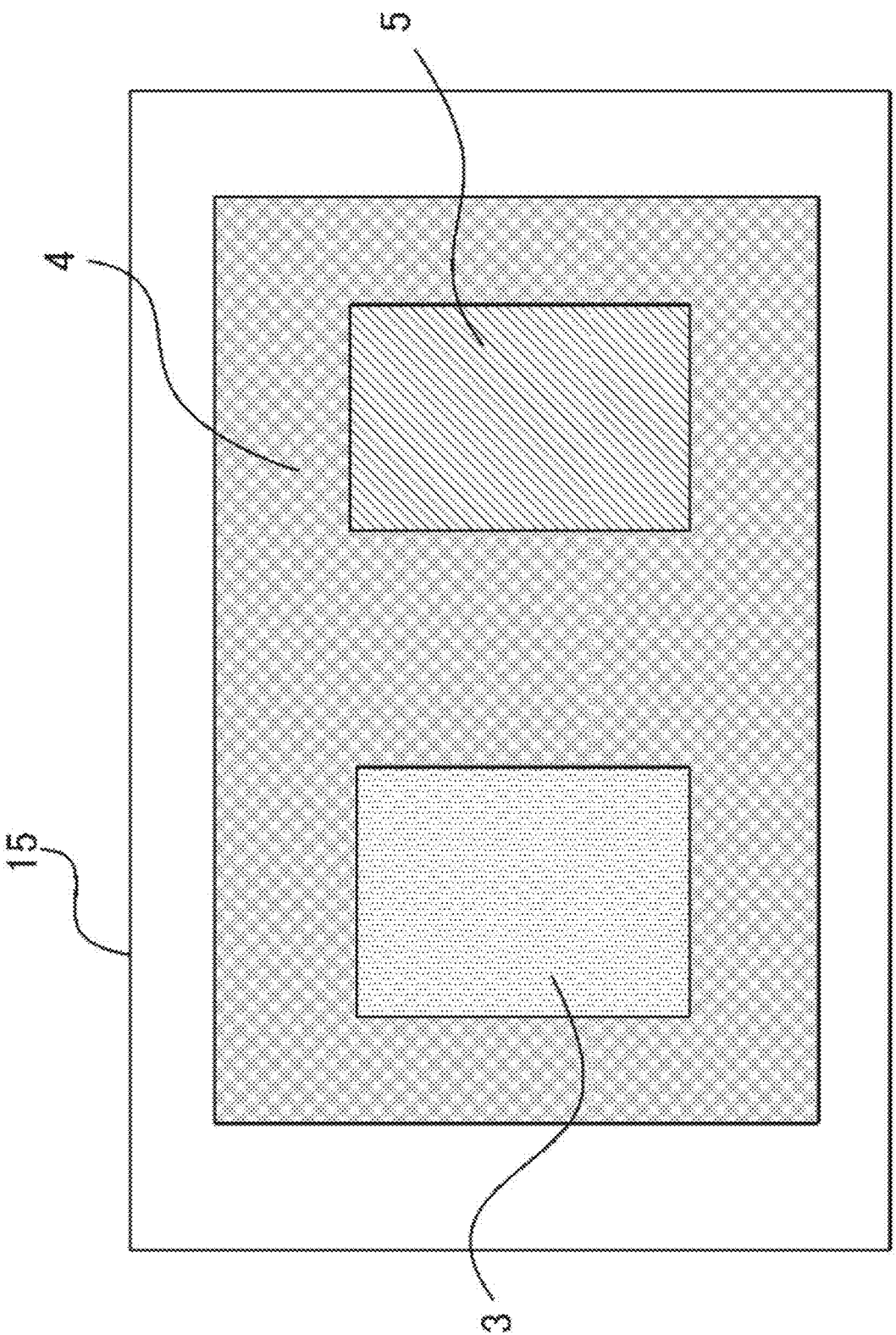
FIG. 3 is an A-A sectional view of FIG. 2.

FIG. 3 shows the inside of the housing 15 of the filter device 10 viewed from upwind in the A-A cross section of FIG. 2. Here, FIG. 3 shows regions where air taken in from the cooling air inlet 16 hits directly the first AC reactor 3, the second AC reactor 4, and the filter capacitors 5 without obstacles. A region can be confirmed in FIG. 3 where, when the LC filter device 10 according to the present embodiment is used, the cooling air directly hits the second AC reactor 4 without being hindered by the first AC reactor 3.

FIG. 4 is a schematic diagram for describing an effect of the LC filter device 10 according to the present embodiment. FIG. 4(a) corresponds to a case in which the present embodiment is used and FIG. 4(b) corresponds to a conventional case in which the second AC reactor 4 is disposed upwind of the first AC reactor 3. In FIG. 4, the dotted arrow lines indicate how the cooling air flows inside the housing 15.

In general, the housing 15 of the filter device 10 is set to a ground potential. Therefore, each of the first AC reactor 3, the second AC reactor 4, and the filter capacitors 5, to which voltage is applied when the PWM converter 2 is driven, is provided apart from the housing 15 so as to be insulated from the housing having a ground potential. While cooling the heat-generating components, the cooling air taken into the housing 15 passes through a gap between the housing 15 and each component and flows toward the cooling air outlet 17.

In the case of a conventional example shown in FIG. 4(b), after hitting the second AC reactor 4 disposed upwind, the cooling air passes through a gap area between the second AC reactor 4 and the housing 15 and flows toward the cooling air outlet 17. Although part of the cooling air flows into gaps, for example, a gap between the iron core and the winding coil of the second AC reactor 4, large part thereof flows into the gap area between the second AC reactor 4 and the housing 15. That is, the cooling air flows around the outer circumference of the second AC reactor 4 and is less likely to hit the first AC reactor 3 and other LC circuit components disposed behind the second AC reactor 4 on the downwind side, so that the cooling air cannot cool those components sufficiently. Particularly, the cooling air barely passes through a part of the first AC reactor 3 located around the center of the housing 15 and behind the second AC reactor 4, and thus the first AC reactor 3 cannot be sufficiently cooled.

As described above, in a case where the second AC reactor 4 is disposed upwind, since the second AC reactor 4 being larger in size compared with the first AC reactor 3 serves as a barrier, the cooling air does not directly hit the first AC reactor 3. Thus, a problem arises in that the first AC reactor 3 cannot be sufficiently cooled.

As shown in FIG. 4(a), in the filter device 10 according to the present embodiment, since the first AC reactor 3 being smaller in size is disposed upwind of the second AC reactor 4 being larger in size, a region of the first reactor 3 that prevents the cooling air from hitting the second AC reactor 4 is small even when the cooling air flows around the outer circumference of the first AC reactor 3. Thus, both the first AC reactor 3 and the second AC reactor 4 can be effectively cooled.

In addition, in the present embodiment, the filter capacitors 5 are disposed upwind of the second AC reactor. Components smaller in size than the second AC reactor 4 can be efficiently cooled by disposing them upwind, instead of the downwind side, of the second AC reactor 4. However, it is needless to say that components may be disposed downwind of the second AC reactor 4 when the necessity of cooling the components is low.

Figure 5:
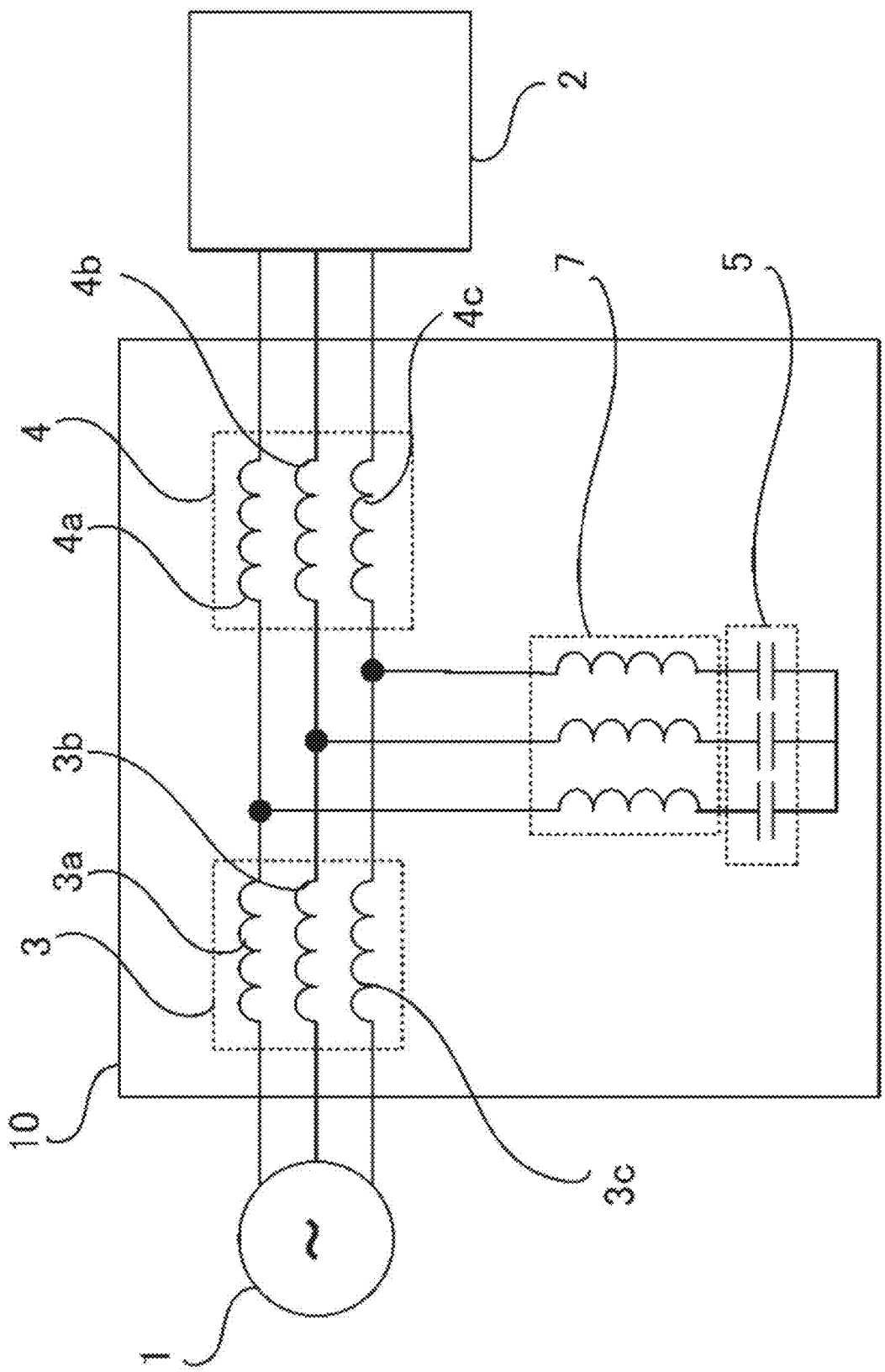
FIG. 5 is a circuit diagram showing a variation of a filter device according to Embodiment 1 of the present invention.

FIG. 5 shows a variation of a power conversion circuit using the LC filter device 10 according to the present embodiment. As shown in FIG. 5, a third AC reactor 7 is provided between the filter capacitors 5 and the connecting portion that is located between the first AC reactor 3 and the second AC reactor 4. The third AC reactor 7 is further provided, and thus the frequency range of the removal that can be done by the filtering can be extended.

Figure 6:
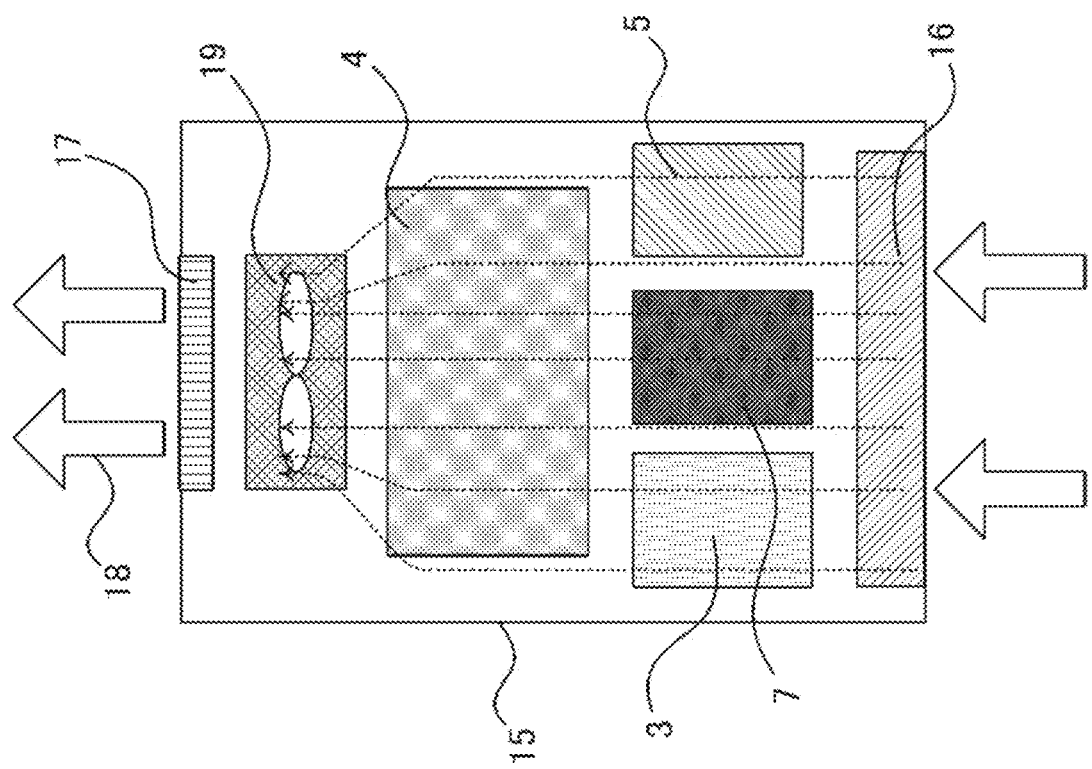
FIG. 6 is a schematic diagram showing an arrangement of the LC circuit components when the variation of the filter device according to Embodiment 1 of the present invention is used.

FIG. 6 is a side view showing the inside of the housing 15 of the filter device 10 provided with the LC circuit shown in FIG. 5. The third AC reactor 7 that is smaller in size than the second AC reactor 4 can also be disposed upwind of the second AC reactor 4, and thus the first AC reactor 3, the second AC reactor 4, and the third AC reactor 7 can be efficiently cooled.

In this way, according to the filter device 10 of the present embodiment, among the AC reactors constituting the LC filter circuit, the first AC reactor 3 that is smaller in size is disposed upwind and the second AC reactor 4 that is larger in size is disposed downwind. Thus, it is possible that the cooling air efficiently hits the LC circuit components, which leads to improvement of the cooling performance.

Furthermore, in the LC filter circuit, since high frequency current components caused by the switching flow in the second AC reactor 4 disposed on the side of the PWM converter 2, an iron loss in the second AC reactor 4 increases. As the result, an amount of heat generated in the second AC reactor 4 is larger than in the first AC reactor 3, which leads to a high-temperature. Here, if the second AC reactor 4 is disposed upwind as in the conventional example, a problem arises in that the cooling air that exchanges heat with the second AC reactor 4 and is heated to a high-temperature cannot sufficiently cool the first AC reactor 3.

In the present embodiment, the cooling air that has cooled the first AC reactor 3 cools the second AC reactor 4 having a higher temperature than the first AC reactor 3, so that both the first AC reactor 3 and the second AC reactor 4 can be efficiently cooled.

Note that, in the present embodiment, the first AC reactor 3 and the second AC reactor 4 are described by exemplifying each structure in which reactors for three phases are integrated, the reactors for three phases may not be integrated. Since the second AC reactor 4 is larger than the first AC reactor 3 even when the reactors for three phases are individually compared in size, the present embodiment can be applied and the same effect can be obtained.

In addition, with respect to the arrangement direction of the AC reactors, the AC reactors can be uniformly cooled if the arrangement direction of the iron core, which is the axis direction of the winding coil, is the same as the flow direction of the cooling air. However, in order to reduce the space inside the housing 15 for the downsizing thereof, the direction of the cooling air and the arrangement direction of the iron core may be different.

Furthermore, in the present embodiment in which the second AC reactor 4 is disposed downwind, the fan 19 is disposed downwind as shown in FIG. 2, so that the suction effect of the cooling air by the fan 19 leads to improvement in the cooling efficiency for the second AC reactor 4.

In the present embodiment, all of the LC circuit components are disposed in a single housing, however, all of them may not be necessarily disposed in a single housing. For example, the filter capacitors 5 are often covered with an insulation resin for their insulation purpose, and thereby having a poor heat dissipation property. In such a case, the filter capacitors 5 may be contained in a housing separate from the housing containing the other LC circuit components. In other words, the filter device according to the present embodiment can be applied to a case in which at least both the first AC reactor 3 and the second AC reactor 4 are contained in a single housing. The other LC circuit components may be disposed separately from the single housing.

In the present embodiment, with regard to a switching device in the PWM converter 2, a device made from a wide band gap material such as silicon carbide (SiC), gallium nitride (GaN), diamond, and gallium oxide (GaO) may be used. For example, in a case where a switching device made from the wide band gap materials including SiC is used, especially, high frequency applications are feasible. In that case, however, the switching frequency generated in the PWM converter 2 is increased, so that the size of the second AC reactor 4 is increased. That is to say, in a case where a switching device made from a wide band gap material is used, the size of the second AC reactor 4 is further increased with respect to the size of the first AC reactor 3, so that the effect obtained from the present embodiment will be remarkable.

Embodiment 2

The filter device 10 according to the present embodiment is different from that according to Embodiment 1 in that the second AC reactor 4 is disposed in an air convergence region of the cooling air.

Figure 7:
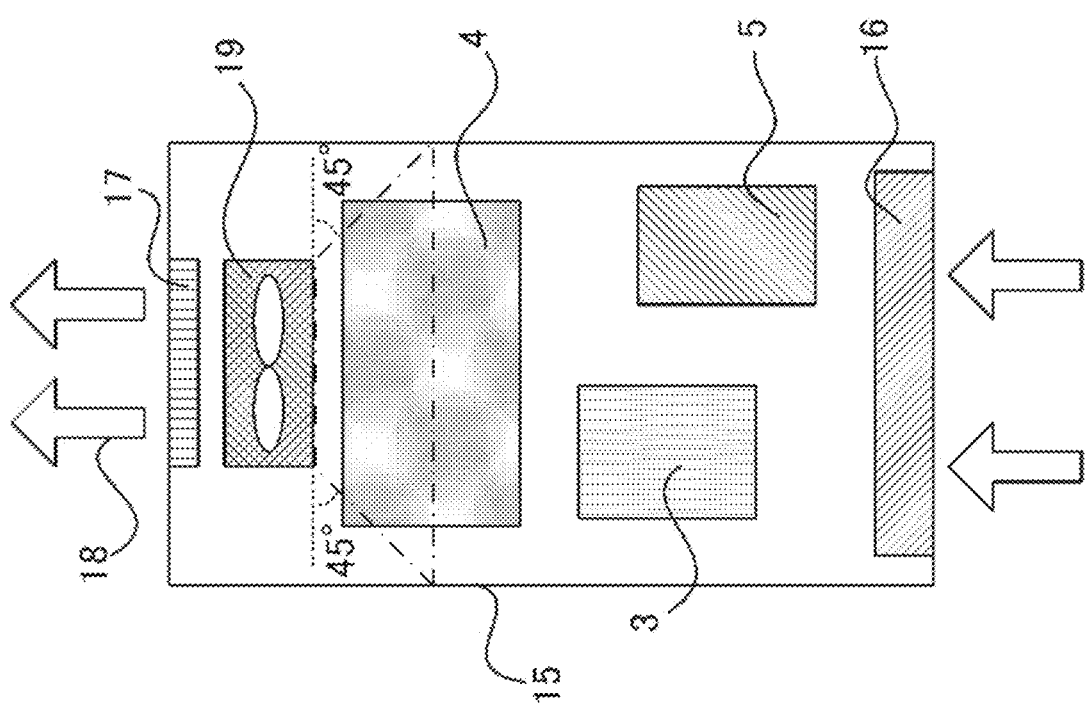
FIG. 7 is a schematic diagram showing an arrangement of the LC circuit components of a filter device according to Embodiment 2 of the present invention.

FIG. 7 is a schematic diagram showing the inside of the housing 15 of the filter device 10 according to the present embodiment. In the present embodiment, the fan 19 is disposed on the side of the cooling air outlet 17. In other words, the fan 19 is disposed downwind and the fan 19 sucks the cooling air, so that cooling efficiency is enhanced. The cooling air entering through the cooling air inlet 16 flows toward the downwind side, while spreading inside the housing 15. In particular, gap areas between the LC circuit components and the housing 15, where neither the first AC reactor 3 nor the filter capacitors 5 serves as the barrier, are paths for the cooling air to flow easily. Thus, the cooling air flows through the gap areas close to the housing 15.

When taken in by the fan 19, the cooling air flowing inside the housing 15 is in conformity with the shape of the fan 19 owing to the sucking force. In other words, the cooling air is taken in such a manner that outer circumference of a cooling air flow path is shrunk. Thus, in the air convergence region where the outer circumference of the cooling air flow path is shrunk with respect to the inner circumference of the housing 15, flow rate of the cooling air per unit area increases. As a result, the total flow amount of the cooling air to hit the second AC reactor 4 disposed in the air convergence region increases.

Here, in the present embodiment, the air convergence region is a region where the outer shape of the cooling air flow path gets narrower toward the downwind side with respect to the outer shape of the housing 15. Considering a function of the fan used in an ordinary filter device, the air convergence region of the fan 19 is indicated by the region surrounded by the dashed-and-dotted line in FIG. 7. For example, the air convergence region can be depicted as a region radiating from the cooling air inlet of the fan 19 at an angle of 45 degrees. That is, in the top view shown in FIG. 7, the air convergence region is assumed to be the region in which the cooling air flow path is shrunk so as to get narrower with respect to the inner circumference of the housing 15 at an angle of 45 degrees. Note that, it suffices that the angle in the air convergence region is substantially 45 degrees.

Note that, the angle of the air convergence region is 45 degrees when the second AC reactor 4 and other components are not disposed. However, when the second AC reactor 4 and other components are disposed in the air convergence region, the actual angle of the air collection region is not exactly 45 degrees due to turbulence of the cooling air. Thus, in the present embodiment, considering the effect obtained in improving the cooling performance by the air taken in, the region in which the cooling air path is shrunk so as to get narrower at an angle of 45 degrees is defined as the air convergence region in the case where the second AC reactor 4 and other components are not disposed.

Figure 8:
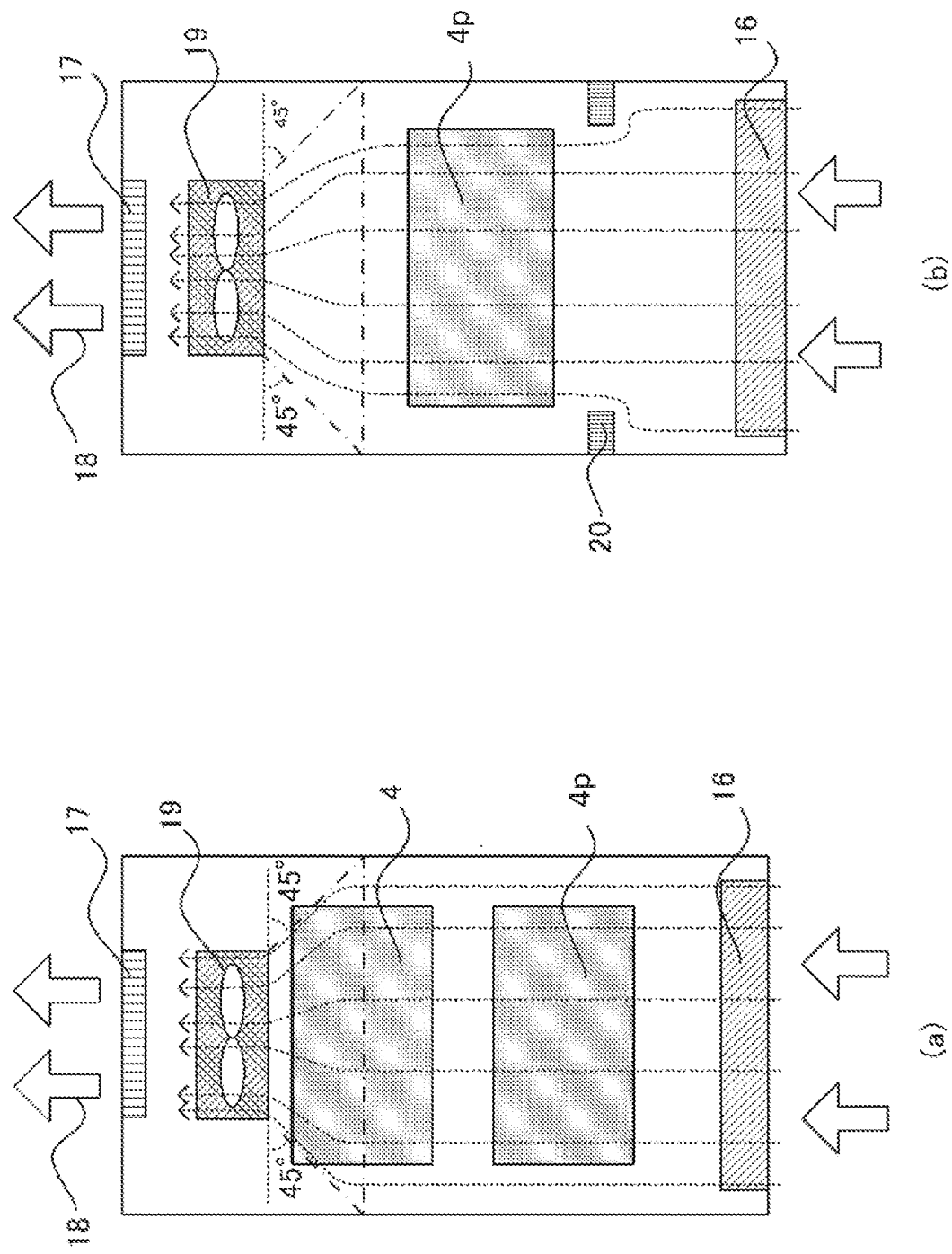
FIG. 8 is a schematic diagram showing an effect of the filter device according to Embodiment 2 of the present invention.

FIG. 8 is a schematic diagram of the inside of the housing 15 for describing an effect of the filter device 1 according to the present embodiment. In FIG. 8, the second AC reactor 4p in a case where the present embodiment is not used is disposed outside the air convergence region.

In FIG. 8(a), the dotted arrow lines show how the cooling air flows inside the housing 15. In the air convergence region, the flow direction of the cooling air change and the size of the flow path of the cooling air is shrunk toward the downwind side. When the present embodiment is used, the cooling air collected in the air convergence region sufficiently hits the second AC reactor 4 to improve the cooling efficiency. To the contrary, when the present embodiment is not used, from among the cooling air passing through a gap area between the second AC reactor 4a and the housing 15 which flows without hitting the second AC reactor 4a, the cooling air passing through the region away from the second AC reactor 4a has a poor heat exchange rate with the second AC reactor 4a, so that the second AC reactor 4a cannot be cooled enough. Thus, the cooling efficiency for the second AC reactor 4a disposed outside the air convergence region decreases.

As shown in FIG. 7, the filter device 1 according to the present embodiment has the second AC reactor 4 disposed in the air convergence region, and thus an effect is such that the cooling efficiency for the second AC reactor 4 can be improved. Note that, in the present embodiment, a part of the second AC reactor 4 may be disposed inside the air convergence region. However, it is desirable that more than half of the second AC reactor 4 in size be disposed inside the air convergence region.

Conventionally, as shown in FIG. 8(b), in a case in which the second AC reactor 4a is disposed outside the air convergence region, a method is known to improve the cooling efficiency for the second AC reactor 4a, in which an air shield plate 20 for the change in the flow path is provided in order for the cooling air to hit the second AC reactor 4a more. Although the cooling efficiency is improved when the air shield plate 20 is added as in the conventional method, this leads to an increase in cost due to the addition of components and an increase in size of the filter device 10.

According to the present embodiment, the cooling air hits well the second AC reactor 4 without using an additional component such as the air shield plate 20, so that the filter device 1 with high cooling efficiency can be obtained at low cost. That is, the total flow amount of the cooling air to hit the second AC reactor 4 can be increased, and thus an effect is such that the second AC reactor 4 whose heat generation amount is large can be sufficiently cooled.

Note that, the fan 19 disposed inside the housing 15 in the present embodiment may be disposed outside the housing 15. For example, even in a case when the fan 19 is provided downwind of the cooling air outlet 17, the effect as mentioned above in the present embodiment will be obtained if the second AC reactor 4 is disposed in the air convergence region where the air convergence effect is produced in the housing 15.

In the present embodiment, only what is different from Embodiment 1 is described. The rest is the same as in Embodiment 1.

Embodiment 3

The filter device 10 according to the present embodiment is different from Embodiment 1 or 2 in that the LC circuit components provided upwind of the second AC reactor 4 are arranged so that the cooling air which would otherwise flow into the gap area between the second AC reactor 4 and the housing 15 is blocked.

Figure 9:
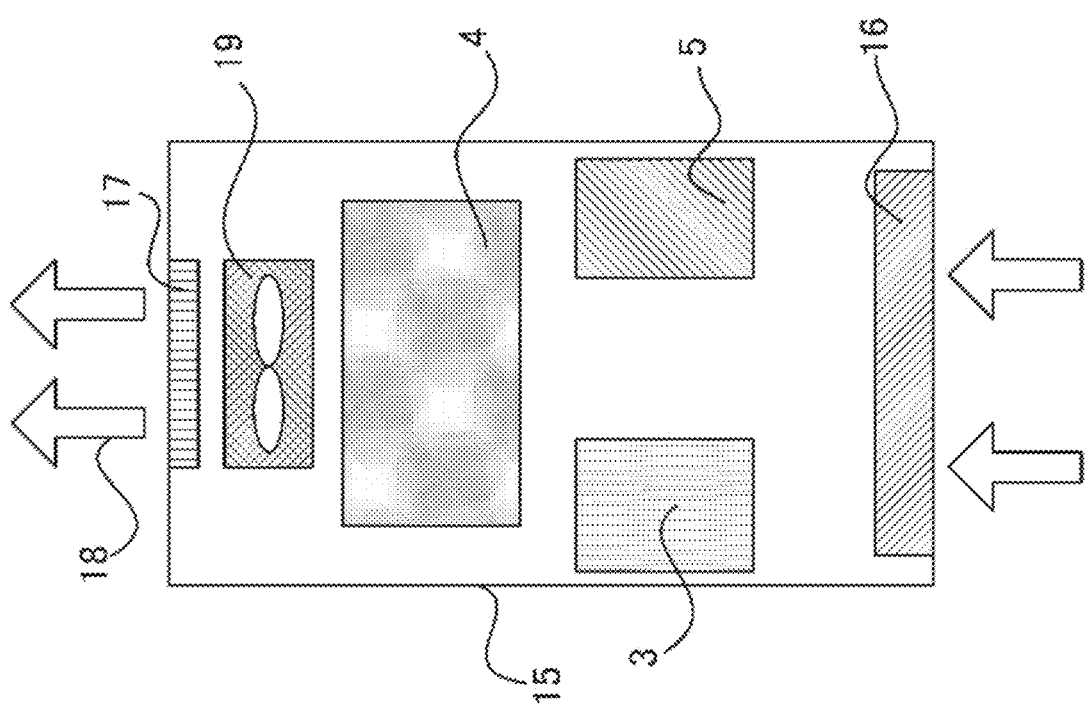
FIG. 9 is a schematic diagram showing an arrangement of the LC circuit components of a filter device according to Embodiment 3 of the present invention.

FIG. 9 is a schematic diagram showing an arrangement of the LC circuit components inside the housing 15 of the filter device 10 according to the present embodiment. As shown in FIG. 9, the first AC reactor 3 and/or the filter capacitors 5 on the upwind side are disposed in such a manner that the cooling air flowing through the gap area between the second AC reactor 4 and the housing 15 disposed downwind is reduced and hits the second AC reactor 4 sufficiently.

To be more specific, when viewed from upwind to downwind, the first AC reactor 3 and/or the filter capacitors 5 are disposed so as to overlap the gap area between the second AC reactor 4 and the housing 15. Since the first AC reactor 3 and the filter capacitors 5 are smaller than the second AC reactor 4 in size, it is difficult that they entirely block the gap area.

By the blocking of a part of the gap area, the cooling air hitting the second AC reactor 4 can be increased, and an effect is such that the cooling efficiency for the second AC reactor 4 can be improved.

Note that, the first AC reactor 3 and/or the filter capacitors 5 are desirably in contact with the housing 15. Even when they are not, the effect from the present embodiment can be obtained. To dispose them in contact with the housing 15, an area thereof where insulation is not required may be used as an adhesive area, or they may be made contact with the housing 15 through a member such as an insulation sheet.

In accordance with the present embodiment, without using an additional component such as the air shield plate 20 shown in FIG. 8(b), the LC circuit components can prevent the cooling air from passing through the gap area between the second AC reactor 4 and the housing 15, so that the cooling efficiency for the second AC reactor 4 can be improved.

In the present embodiment, although the first AC reactor 3 and/or the filter capacitors 5 are used to guide the cooling air in the direction toward the second AC reactor 4, other LC circuit components may be used. For example, the damping resistors 6 shown in FIG. 1 or the third AC reactor 7 shown in FIG. 5 may be disposed to prevent the cooling air from flowing through the gap area between the second AC reactor 4 and the housing 15.

Not to mention, in the present embodiment, the second AC reactor 4 may be disposed in the air convergence region as shown in Embodiment 2. The second AC reactor 4 is disposed in the air convergence region, and the cooling air is guided toward the second AC reactor 4 by disposing the LC circuit components on the upwind side, so that the cooling air can reliably hits the second AC reactor 4.

Note that, in the present embodiment, only what is different from Embodiment 1 or 2 is described. The rest is the same as in Embodiment 1 or 2.

The configurations described above in the embodiments are examples of the contents of the present invention. They can be combined with any known technique as well as omitted and changed in part without deviating from the gist of the present invention.

DESCRIPTION OF SYMBOLS

1 AC power source
2 PWM convertor
3 first AC reactor
4 second AC reactor
5 filter capacitor
6 damping resistor
7 third AC reactor
10 filter device
15 housing
16 cooling air inlet
17 cooling air outlet
19 fan
20 air shield plate

The invention claimed is:

1. A power converter comprising:
a PWM converter;
a first AC reactor to be connected to an AC power source;
a second AC reactor connected between the PWM converter and the first AC reactor;
a filter capacitor whose one end is connected to a connecting portion between the first AC reactor and the second AC reactor; and
a housing having a cooling air inlet and a cooling air outlet and containing the first AC reactor and the second AC reactor,
wherein the first AC reactor is disposed upwind of the second AC reactor and is smaller in size than the second AC reactor in a cross sectional view seen from upwind to downwind.

2. The power converter according to claim 1, wherein the PWM converter includes a switching device made from a wide band gap material.

3. A filter device comprising:
a first AC reactor to be connected to an AC power source;
a second AC reactor that is connected between a PWM converter and the first AC reactor;
a filter capacitor whose one end is connected to a connecting portion between the first AC reactor and the second AC reactor;
a third AC reactor connected between the connecting portion and the filter capacitor; and
a housing having a cooling air inlet and a cooling air outlet and containing the first AC reactor, the second AC reactor, and the third AC reactor,
wherein both the first AC reactor and the third AC reactor are disposed upwind of the second AC reactor.

4. The filter device according to claim 3, wherein the filter capacitor is disposed upwind of the second AC reactor.

5. The filter device according to claim 3, further comprising a fan disposed downwind of the second AC reactor in the housing, wherein the second AC reactor is disposed in an air convergence region by the fan.

6. The filter device according to claim 3, wherein the first AC reactor is disposed so as to overlap a gap area between the second AC reactor and the housing in the cross sectional view seen from upwind to downwind.

7. The filter device according to claim 3, wherein the filter capacitor is disposed so as to overlap a gap area between the second AC reactor and the housing in the cross sectional view seen from upwind to downwind.

8. The filter device according to claim 3, wherein an axis direction of the second AC reactor coincides with a flow direction of cooling air.

9. A filter device comprising:
a first AC reactor to be connected to an AC power source;
a second AC reactor that is connected between a PWM converter and the first AC reactor;
a filter capacitor whose one end is connected to a connecting portion between the first AC reactor and the second AC reactor; and
a housing having a cooling air inlet and a cooling air outlet and containing the first AC reactor and the second AC reactor,
wherein the first AC reactor is disposed upwind of the second AC reactor and is smaller in size than the second AC reactor in a cross sectional view seen from upwind to downwind.

10. The filter device according to claim 9, wherein an axis direction of the second AC reactor coincides with a flow direction of cooling air.

11. The filter device according to claim 9, further comprising a third AC reactor connected between the connecting portion and the filter capacitor, wherein the third AC reactor is disposed upwind of the second AC reactor in the housing so as to overlap a gap area between the second AC reactor and the housing in the cross sectional view seen from upwind to downwind.

12. The filter device according to claim 11, wherein the first AC reactor is disposed so as to overlap the gap area between the second AC reactor and the housing in the cross sectional view seen from upwind to downwind.

13. The filter device according to claim 11, wherein the filter capacitor is disposed so as to overlap the gap area between the second AC reactor and the housing in the cross sectional view seen from upwind to downwind.

14. The filter device according to claim 11, wherein the filter capacitor is disposed upwind of the second AC reactor.

15. The filter device according to claim 11, wherein an axis direction of the second AC reactor coincides with a flow direction of cooling air.

16. The filter device according to claim 11, further comprising a fan disposed downwind of the second AC reactor in the housing, wherein the second AC reactor is disposed in an air convergence region by the fan.

17. The filter device according to claim 9, further comprising a fan disposed downwind of the second AC reactor in the housing, wherein the second AC reactor is disposed in an air convergence region by the fan.

18. The filter device according to claim 9, wherein the filter capacitor is disposed upwind of the second AC reactor.

19. The filter device according to claim 9, wherein the first AC reactor is disposed so as to overlap a gap area between the second AC reactor and the housing in the cross sectional view seen from upwind to downwind.

20. The filter device according to claim 9, wherein the filter capacitor is disposed so as to overlap a gap area between the second AC reactor and the housing in the cross sectional view seen from upwind to downwind.

* * * * *